(12) United States Patent
Koo et al.

(10) Patent No.: US 11,450,504 B2
(45) Date of Patent: Sep. 20, 2022

(54) GEH$_4$/AR PLASMA CHEMISTRY FOR ION IMPLANT PRODUCTIVITY ENHANCEMENT

(71) Applicant: APPLIED Materials, Inc., Santa Clara, CA (US)

(72) Inventors: Bon-Woong Koo, Andover, MA (US); Ajdin Sarajlic, Bedford, NH (US); Ronald Johnson, Gloucester, MA (US); Nunzio V. Carbone, Hamilton, MA (US); Peter Ewing, South Berwick, ME (US); Mervyn Deegan, South Hamilton, MA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 17/023,879

(22) Filed: Sep. 17, 2020

(65) Prior Publication Data

US 2021/0005416 A1    Jan. 7, 2021

Related U.S. Application Data (62) Division of application No. 16/178,167, filed on Nov. 1, 2018, now Pat. No. 10,923,309.

(51) Int. Cl.
*H01J 37/08*        (2006.01)
*H01J 37/317*       (2006.01)

(52) U.S. Cl.
CPC .......... *H01J 37/08* (2013.01); *H01J 37/3171* (2013.01); *H01J 2237/0815* (2013.01)

(58) Field of Classification Search
None
See application file for complete search history.

(56) References Cited

U.S. PATENT DOCUMENTS

| | | |
|---|---|---|
| 2004/0188631 A1 | 9/2004 | Horsky et al. |
| 2006/0238133 A1 | 10/2006 | Horsky et al. |
| 2008/0075880 A1 | 3/2008 | Renau et al. |
| 2011/0021011 A1* | 1/2011 | Sweeney ............ C23C 14/06 438/515 |

(Continued)

FOREIGN PATENT DOCUMENTS

| | | |
|---|---|---|
| JP | 2010-267623 A | 11/2010 |
| JP | 2011-66022 A | 3/2011 |

(Continued)

OTHER PUBLICATIONS

International Search Report and Written Opinion dated Jan. 17, 2020 in corresponding PCT application No. PCT/US2019/053951.

(Continued)

*Primary Examiner* — Michael J Logie
(74) *Attorney, Agent, or Firm* — Nields, Lemack & Frame, LLC (57) ABSTRACT

A method for improving the beam current for certain ion beams, and particularly germanium and argon, is disclosed. The use of argon as a second gas has been shown to improve the ionization of germane, allowing the formation of a germanium ion beam of sufficient beam current without the use of a halogen. Additionally, the use of germane as a second gas has been shown to improve the beam current of an argon ion beam.

5 Claims, 8 Drawing Sheets

(56) References Cited

U.S. PATENT DOCUMENTS

| | | | |
|---|---|---|---|
| 2011/0079241 A1* | 4/2011 | Sinha | C23C 14/564 134/1.1 |
| 2012/0142174 A1* | 6/2012 | Kaim | H01J 37/3002 438/513 |
| 2013/0140473 A1 | 6/2013 | Colvin et al. | |
| 2014/0041684 A1 | 2/2014 | Kurunczi et al. | |
| 2014/0322902 A1* | 10/2014 | Sinha | H01L 21/26506 438/514 |
| 2014/0357068 A1 | 12/2014 | Horigome et al. | |
| 2015/0126040 A1 | 5/2015 | Korolik et al. | |
| 2015/0206690 A1 | 7/2015 | Li et al. | |
| 2016/0027607 A1 | 1/2016 | Graupera et al. | |
| 2016/0046849 A1 | 2/2016 | Mayer et al. | |
| 2016/0163510 A1* | 6/2016 | Koo | C23C 14/06 438/515 |
| 2017/0292186 A1 | 10/2017 | Reinicker et al. | |
| 2017/0294314 A1* | 10/2017 | Reinicker | C23C 14/564 134/1.1 |
| 2018/0233365 A1 | 8/2018 | Kim et al. | |
| 2020/0144018 A1 | 5/2020 | Koo et al. | |

FOREIGN PATENT DOCUMENTS

| | | |
|---|---|---|
| JP | 2013-506962 A | 2/2013 |
| JP | 2013-521596 A | 6/2013 |
| JP | 2013-165254 A | 8/2013 |
| JP | 2014-216311 A | 11/2014 |
| WO | 2014/137872 A1 | 9/2014 |

OTHER PUBLICATIONS

Graf et al. "Germanium Performance in the Eaton RF ion source", IEEE, 1999.
Office action dated Dec. 2, 2019 in co-pending U.S. Appl. No. 16/178,167.
Office action dated Feb. 5, 2020 in co-pending U.S. Appl. No. 16/178,167.
Final rejection dated May 4, 2020 in co-pending U.S. Appl. No. 16/178,167.
Office action dated Aug. 21, 2020 in co-pending U.S. Appl. No. 16/178,167.
Notice of allowance dated Sep. 9, 2020 in co-pending U.S. Appl. No. 16/178,167.

* cited by examiner

GEH$_4$/AR PLASMA CHEMISTRY FOR ION IMPLANT PRODUCTIVITY ENHANCEMENT

This application is a divisional of U.S. patent application Ser. No. 16/178,167 filed on Nov. 1, 2018, the disclosure of which is incorporated herein by reference in its entirety.

FIELD

Embodiments of the present disclosure relate to methods for enhancing productivity in an ion implantation system, and more particularly, improving the beam current of germanium and argon ion beams.

BACKGROUND

The fabrication of a semiconductor device involves a plurality of discrete and complex processes. One such process may be an etch process, where material is removed from the workpiece. Another process may be a deposition process, wherein material is deposited on the workpiece. Yet another process may be an ion implantation process where ions are implanted into the workpiece.

An ion source is traditionally used to create the ions, which are subsequently used to perform these processes. The ion source may utilize an indirectly heated cathode (IHC), a Bernas source, a capacitively coupled plasma source, a radio frequency (RF) plasma source or an inductively coupled source disposed within or proximate the chamber of the ion source. A gas tube is in fluid communication with the ion source, in order to supply the desired feed gas to the ion source chamber. The feed gas may be any suitable species, typically a Group III or Group V element.

However, germanium is increasingly used in semiconductor device manufacturing processes, especially low energy, high dose application. Currently, germanium tetrafluoride (GeF$_4$) is used as the main dopant gas, and some diluent gas, such as xenon dihydride (XeH$_2$) or CH$_3$F, is used to reduce the halogen cycle and maintain the life of the ion source.

Additionally, argon is also increasingly being used and explored for various applications such as precision materials engineering (PME), selective area processing (SAP) and directional etching for 3D devices. These applications typically utilize ultra high doses.

However, the formation of a germanium ion beam having sufficient beam current without the use of a halogen gas has been challenging. Further, the generation of an argon ion beam with sufficient beam current has also been elusive.

Therefore, a method which improves beam current for germanium and argon ion beams, particular without the use of halogen species, would be beneficial.

SUMMARY

A method for improving the beam current for certain ion beams, and particularly germanium and argon, is disclosed. The use of argon as a second gas has been shown to improve the ionization of germane, allowing the formation of a germanium ion beam of sufficient beam current without the use of a halogen. Additionally, the use of germane as a second gas has been shown to improve the beam current of an argon ion beam.

According to one embodiment, a method of generating a germanium ion beam is disclosed. The method comprises introducing germane and argon into an ion source; ionizing the germane and argon to form a plasma; and extracting germanium ions from the ion source to form the germanium ion beam. In certain embodiments, no halogen gasses are introduced into the ion source. In some embodiments, the flow rate of argon is between 0.5 and 2.0 sccm. In certain embodiments, the flow rate of argon is between 0.7 and 1.0 sccm. In certain embodiments, the ion source comprises an indirectly heated cathode ion source. In some embodiments, the ion source comprises an RF ion source. In other embodiments, the ion source comprises a Bernas source, a capacitively coupled plasma source, an inductively coupled source, or a microwave coupled plasma source. In certain embodiments, the flow rate of argon is such that the efficiency of the ion source, defined as a ratio of germanium beam current to total power applied to the ion source, is greater than 4 mA per kW. In some embodiments, the flow rate of argon is such that a normalized efficiency of the ion source, defined as the efficiency of the ion source divided by an extraction current, is greater than 0.1. In certain embodiments, the ion source is a component of a beam-line implantation system.

According to another embodiment, a method of generating an argon ion beam is disclosed. The method comprises introducing germane and argon into an ion source; ionizing the germane and argon to form a plasma; and extracting argon ions from the ion source to form the argon ion beam, wherein a flow rate of germane is between 0.35 and 1.00 sccm. In certain embodiments, the ion source comprises an indirectly heated cathode ion source. In some embodiments, the ion source comprises an RF ion source. In other embodiments, the ion source comprises a Bernas source, a capacitively coupled plasma source, an inductively coupled source, or a microwave coupled plasma source. In certain embodiments, no halogen gasses are introduced into the ion source. In certain embodiments, the ion source is a component of a beam-line implantation system.

According to another embodiment, a method of generating an argon ion beam is disclosed. The method comprises introducing germane and argon into an ion source; ionizing the germane and argon to form a plasma; and extracting argon ions from the ion source to form the argon ion beam, wherein a flow rate of germane is such that a beam current of the argon ion beam is increased at least 10% relative to an argon ion beam generated without use of germane at a same extraction current. In certain embodiments, the flow rate of germane is such that a beam current of the argon beam is increased at least 15% relative to the argon beam generated without use of germane at a same extraction current. In certain embodiments, no halogen gasses are introduced into the ion source. In certain embodiments, the ion source is a component of a beam-line implantation system.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
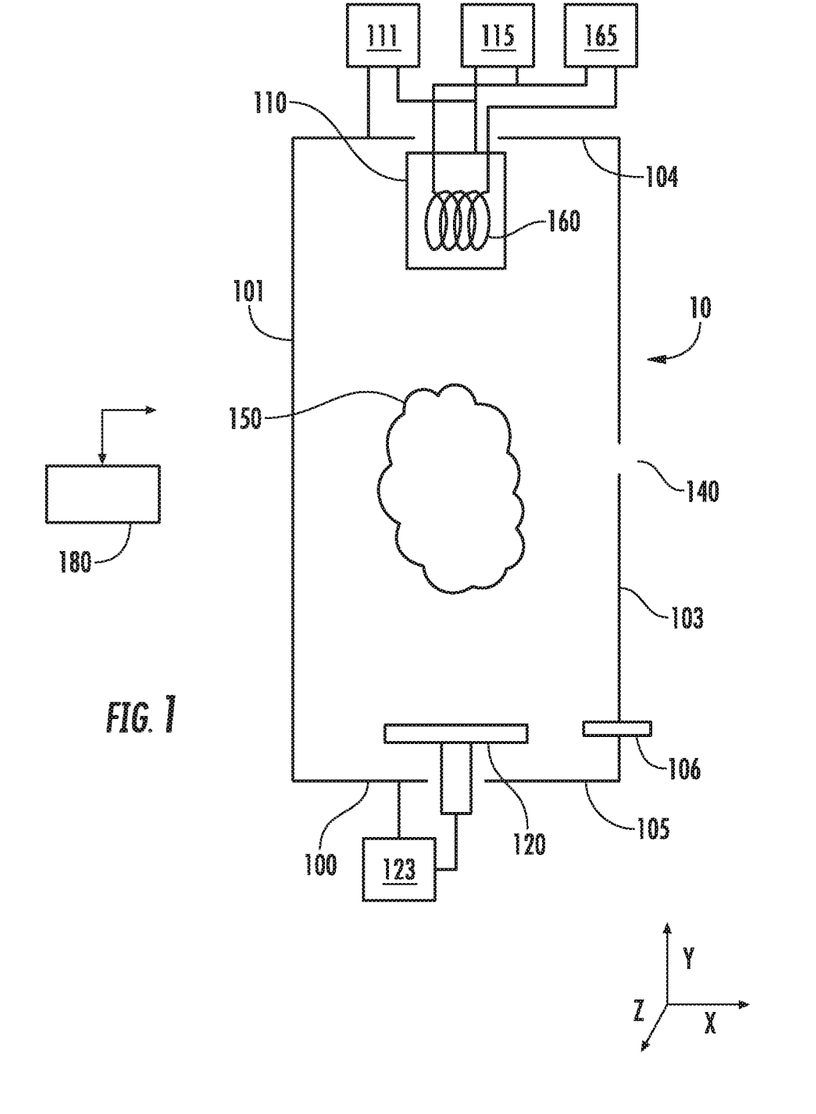
FIG. 1 shows an indirectly heated cathode (IHC) ion source that may be used in certain embodiments.

FIG. 1 shows an IHC ion source 10 that may be used in certain embodiments of the present disclosure. The IHC ion source 10 includes an arc chamber 100, comprising two opposite ends, and walls 101 connecting to these ends. The walls 101 of the arc chamber 100 may be constructed of an electrically conductive material and may be in electrical communication with one another. In some embodiments, a liner may be disposed proximate one or more of the walls 101. A cathode 110 is disposed in the arc chamber 100 at a first end 104 of the arc chamber 100. A filament 160 is disposed behind the cathode 110. The filament 160 is in communication with a filament power supply 165. The filament power supply 165 is configured to pass a current through the filament 160, such that the filament 160 emits thermionic electrons. Cathode bias power supply 115 biases filament 160 negatively relative to the cathode 110, so these thermionic electrons are accelerated from the filament 160 toward the cathode 110 and heat the cathode 110 when they strike the back surface of cathode 110. The cathode bias power supply 115 may bias the filament 160 so that it has a voltage that is between, for example, 250-500V, more negative than the voltage of the cathode 110. The cathode 110 then emits thermionic electrons on its front surface into arc chamber 100.

Thus, the filament power supply 165 supplies a current to the filament 160. The cathode bias power supply 115 biases the filament 160 so that it is more negative than the cathode 110, so that electrons are attracted toward the cathode 110 from the filament 160. In certain embodiments, the cathode 110 may be biased relative to the arc chamber 100, such as by arc power supply 111. In other embodiments, the cathode 110 may be electrically connected to the arc chamber 100, so as to be at the same voltage as the walls 101 of the arc chamber 100. In these embodiments, arc power supply 111 may not be employed and the cathode 110 may be electrically connected to the walls 101 of the arc chamber 100. In certain embodiments, the arc chamber 100 is connected to electrical ground.

On the second end 105, which is opposite the first end 104, a repeller 120 may be disposed. The repeller 120 may be biased relative to the arc chamber 100 by means of a repeller bias power supply 123. In other embodiments, the repeller 120 may be electrically connected to the arc chamber 100, so as to be at the same voltage as the walls 101 of the arc chamber 100. In these embodiments, repeller bias power supply 123 may not be employed and the repeller 120 may be electrically connected to the walls 101 of the arc chamber 100. In still other embodiments, a repeller 120 is not employed.

The cathode 110 and the repeller 120 are each made of an electrically conductive material, such as a metal or graphite.

In certain embodiments, a magnetic field is generated in the arc chamber 100. This magnetic field is intended to confine the electrons along one direction. The magnetic field typically runs parallel to the walls 101 from the first end 104 to the second end 105. For example, electrons may be confined in a column that is parallel to the direction from the cathode 110 to the repeller 120 (i.e. the y direction). Thus, electrons do not experience any electromagnetic force to move in the y direction. However, movement of the electrons in other directions may experience an electromagnetic force.

Disposed on one side of the arc chamber 100, referred to as the extraction plate 103, may be an extraction aperture 140. In FIG. 1, the extraction aperture 140 is disposed on a side that is parallel to the Y-Z plane (perpendicular to the page). Further, the IHC ion source 10 also comprises a gas inlet 106 through which the gas or gasses to be ionized may be introduced to the arc chamber 100. The electrons collide with the gas or gasses to form a plasma 150.

In certain embodiments, a first electrode and a second electrode may be disposed on respective opposite walls 101 of the arc chamber 100, such that the first electrode and the second electrode are within the arc chamber 100 on walls adjacent to the extraction plate 103. The first electrode and the second electrode may each be biased by a respective power supply. In certain embodiments, the first electrode and the second electrode may be in communication with a common power supply. However, in other embodiments, to allow maximum flexibility and ability to tune the output of the IHC ion source 10, the first electrode may be in communication with a first electrode power supply and the second electrode may be in communication with a second electrode power supply.

In certain embodiments, a controller 180 may be used to control the IHC ion source 10. The controller 180 may include a processing unit and a storage element. The storage element may be any suitable non-transitory memory device, such as semiconductor memory (i.e. RAM, ROM, EEPROM, FLASH RAM, DRAM, etc.), magnetic memory (i.e. disk drives), or optical memory (i.e. CD ROMs). The storage element may be used to contain the instructions, which when executed by the processing unit in the controller 180, allow the ion implanter to perform the functions described herein.

Figure 2:
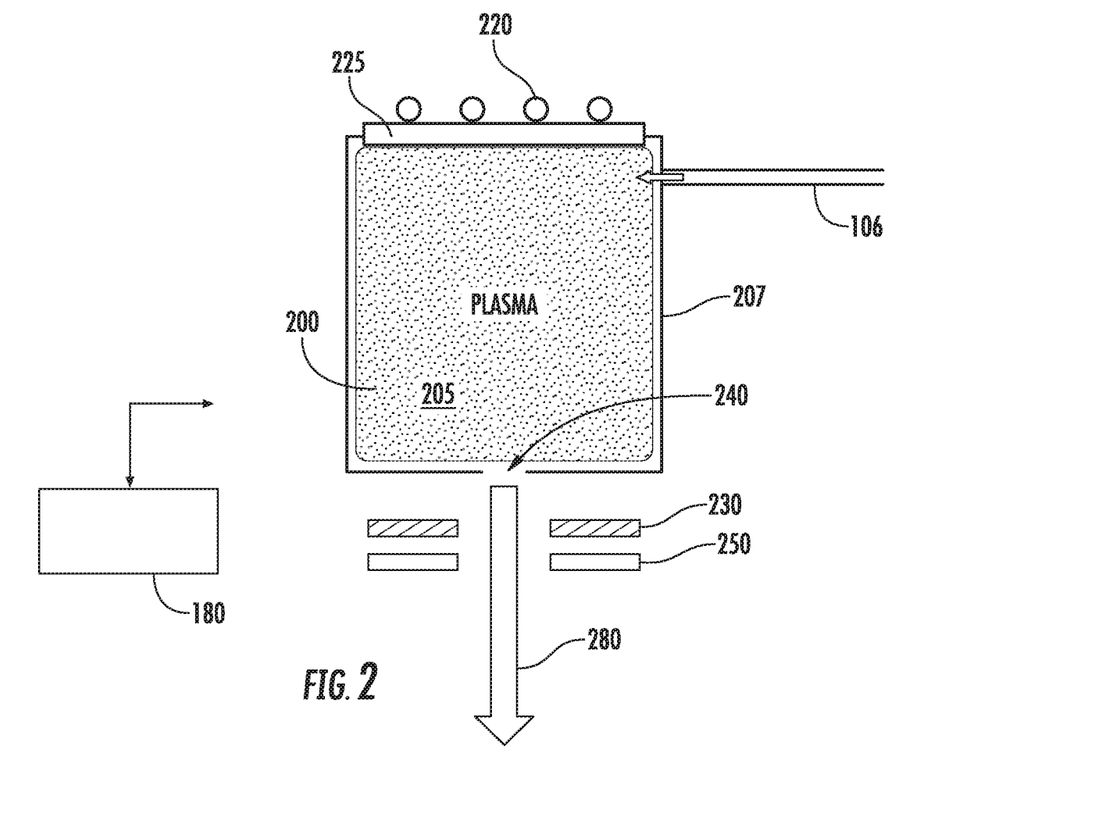
FIG. 2 shows a plasma chamber that may be used as an RF ion source in certain embodiments.

FIG. 2 shows a radio frequency (RF) ion source 200 that may be used in certain embodiments. In this embodiment, the RF ion source 200 includes a chamber 205 defined by several walls 207, which may be constructed from graphite or another suitable material. This chamber 205 may be supplied with one or more source gasses via a gas inlet 106. This source gas may be energized by an RF antenna 220 or another mechanism. The RF antenna 220 is in electrical communication with a RF power supply (not shown) which supplies power to the RF antenna 220. A dielectric window 225, such as a quartz or alumina window, may be disposed between the RF antenna 220 and the interior of the chamber 205. The RF ion source 200 also includes an aperture 240 through which ions may pass. A negative voltage is applied to extraction suppression electrode 230 disposed outside the aperture 240 to extract the positively charged ions from within the chamber 205 through the aperture 240 and toward the workpiece. A ground electrode 250 may also be employed. In some embodiments, the aperture 240 is located on the side of the RF ion source 200 opposite the side containing the dielectric window 225. Ions extracted from the chamber 205 are formed into an ion beam 280, which is directed toward the workpiece.

In certain embodiments, a controller 180 may be used to control the RF ion source 200.

The ion source is not limited to those shown in FIGS. 1-2. In other embodiments, the ion source may utilize a Bernas source, a capacitively coupled plasma source, an inductively coupled source, or a microwave coupled plasma source disposed within or proximate the chamber of the ion source.

As stated above, gas enters the ion source via a gas inlet 106. In the present disclosure, at least two gasses are introduced into the ion source, a germanium-based gas, such as germane, and argon. Additional gasses, such as hydrogen, may also be used.

Figure 3A:
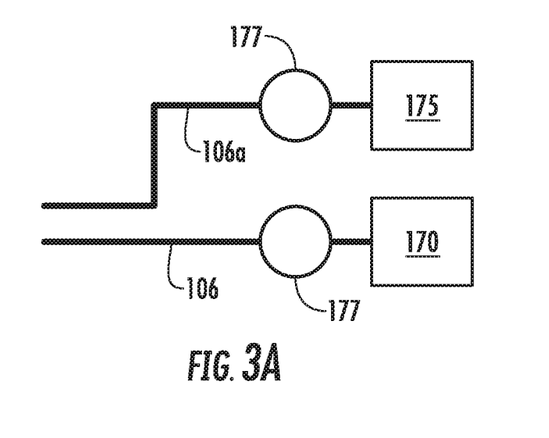
FIGS. 3A-3C show different configurations that allow at least two gasses to be introduced into an ion source.

These gasses may be connected to the ion source in a plurality of configurations. In FIG. 3A, the first source gas may be stored in the first gas container 170 and introduced to the chamber through the gas inlet 106. The second source gas may be stored in a second gas container 175 and introduced to the arc chamber 100 through a second gas inlet 106a. In another embodiment, shown in FIG. 3B, the second source gas may be stored in a second gas container 176 and introduced to the chamber through the same gas inlet 106 used by the first source gas. In yet another embodiment, shown in FIG. 3C, the second source gas may be mixed with the first source gas in a single gas container 178. This mixture of gasses is then introduced to the chamber through gas inlet 106.

Figure 3B:
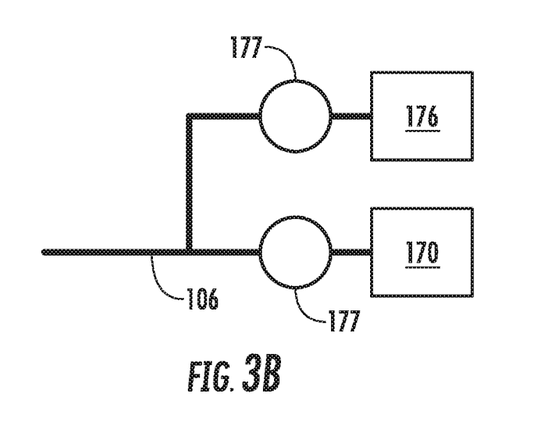

In the embodiments of FIGS. 3A-3B, the first source gas and the second source gas may be introduced simultaneously or sequentially to the chamber.

Figure 3C:
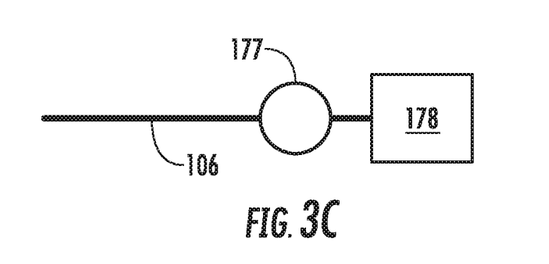

In certain embodiments, one or more mass flow controllers (MFC) 177 may be used to regulate the amount of each gas that is introduced into the ion source. The MFCs 177 may be in communication with the controller 180 that determines an appropriate amount of each gas to utilize.

In certain embodiments, the workpiece may be disposed proximate the opening in the ion source, such as proximate the extraction aperture 140 in FIG. 1 or the aperture 240 in FIG. 2. In certain embodiments, there may be one or more electrodes outside the ion source chamber to attract ions from within the ion source, such as is shown in FIG. 2. In other embodiments, the ion source may be part of an ion implanter.

Figure 4:
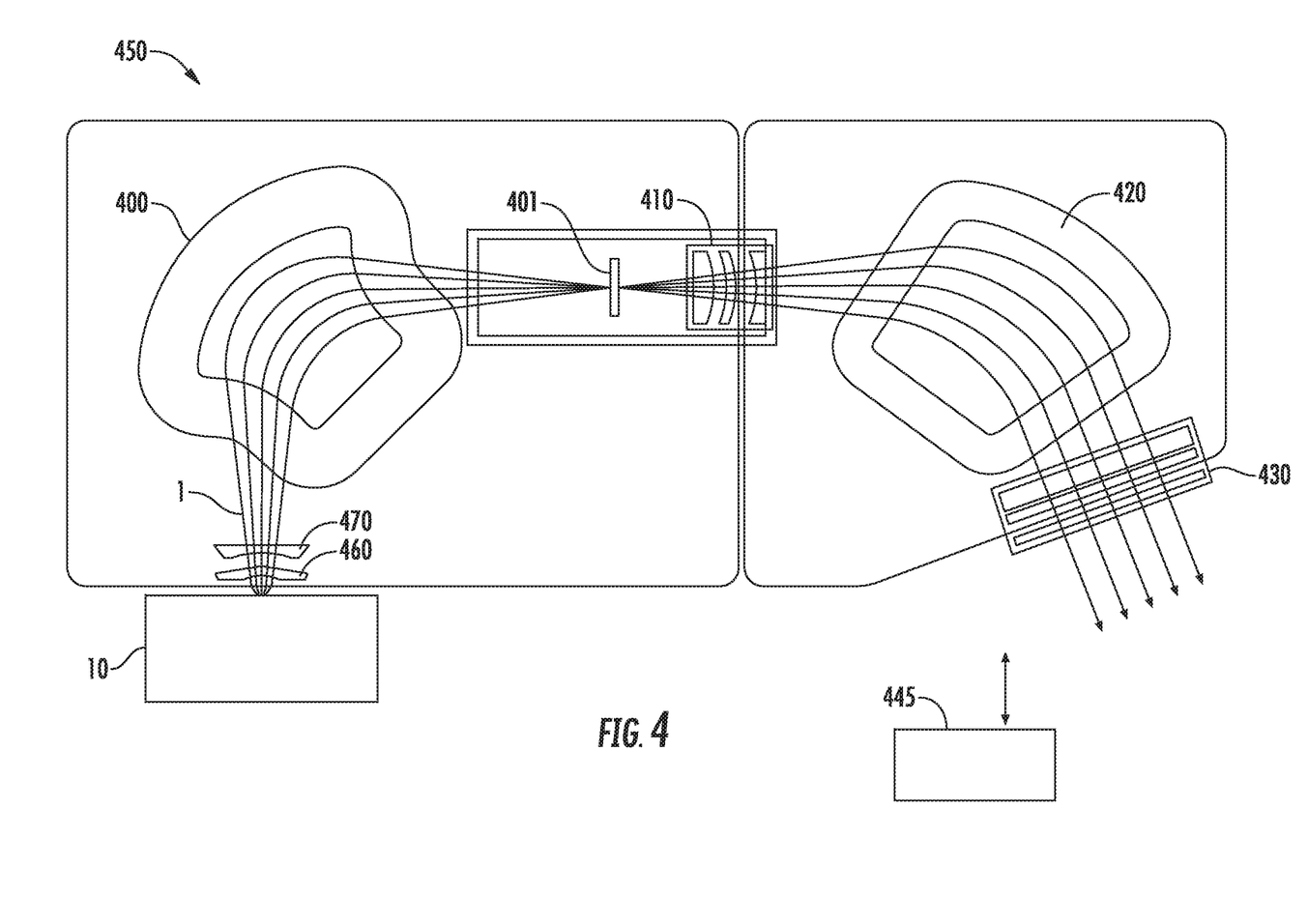
FIG. 4 shows a beamline implantation system that may employ the ion source of FIG. 1 or FIG. 2 according to one embodiment.

FIG. 4 shows a representative ion implanter 450 that utilizes the IHC ion source 10 shown in FIG. 1 or the RF ion source 200 shown in FIG. 2. After the ribbon ion beam 1 passes through the suppression electrode 460 and the ground electrode 470, the ribbon ion beam 1 enters a mass analyzer 400. The mass analyzer 400, having a resolving aperture 401, is used to remove unwanted components from the ribbon ion beam 1, resulting in a ribbon ion beam 1 having the desired energy and mass characteristics passing through resolving aperture 401. Ions of the desired species then pass through a first deceleration stage 410, which may include one or more electrodes. The output of the first deceleration stage 410 may be a diverging ion beam.

A corrector magnet 420 is adapted to deflect the divergent ion beam into a set of individual beamlets having substantially parallel trajectories. The corrector magnet 420 may comprise a magnetic coil and magnetic pole pieces that are spaced apart to form a gap, through which the ion beamlets pass. The magnetic coil is energized so as to create a magnetic field within the gap, which deflects the ion beamlets in accordance with the strength and direction of the applied magnetic field. The magnetic field is adjusted by varying the current through the magnetic coil. Alternatively, other structures, such as parallelizing lenses, can also be utilized to perform this function.

In certain embodiments, the corrector magnet 420 may also comprise other components that are used to improve the uniformity of the ribbon ion beam 1. For example, quadrupole magnets, multiple rods and energy purity modules may be employed to manipulate the ribbon ion beam 1, attempting to improve its uniformity and angles. These components manipulate the ribbon ion beam 1 so as to make the beam current nearly uniform across its entire length, while maintaining the parallelism of the individual ion beamlets.

Following the corrector magnet 420, the ribbon ion beam 1 is targeted toward the workpiece. In some embodiments, a second deceleration stage 430 may be added between the workpiece and the corrector magnet 420.

Further, a controller 445 may be disposed in the ion implanter 450. In some embodiments, this controller 445 may be the same as controller 180. In other embodiments, two controllers may be utilized. The controller 445 may include a processing unit and a storage element. The storage element may be any suitable non-transitory memory device, such as semiconductor memory (i.e. RAM, ROM, EEPROM, FLASH RAM, DRAM, etc.), magnetic memory (i.e. disk drives), or optical memory (i.e. CD ROMs). The storage element may be used to contain the instructions, which when executed by the processing unit in the controller 445, allow the ion implanter to perform the functions described herein.

As stated above, in certain embodiments, it is desirable to create an ion beam comprising germanium ions. This is traditionally done using germanium tetrafluoride (GeF$_4$) as the source gas in the ion source. However, any source gas that comprises a halogen may have a deleterious effect on the ion source. Specifically, the halogen may etch the metals in the ion source, shortening their life.

Previously, attempts have been made to utilize germane (GeH$_4$) as the source gas in the ion source. However, the resulting beam current is significantly lower than that created when using GeF$_4$ as the source gas.

However, unexpectedly, it has been found that the use of argon as a second source gas significantly boosts the beam current when germane is used as the first source gas. The first and second source gasses may be introduced into the ion source using any of the configurations shown in FIGS. 3A-3C. Further, they may be introduced sequentially or simultaneously.

Figure 5:
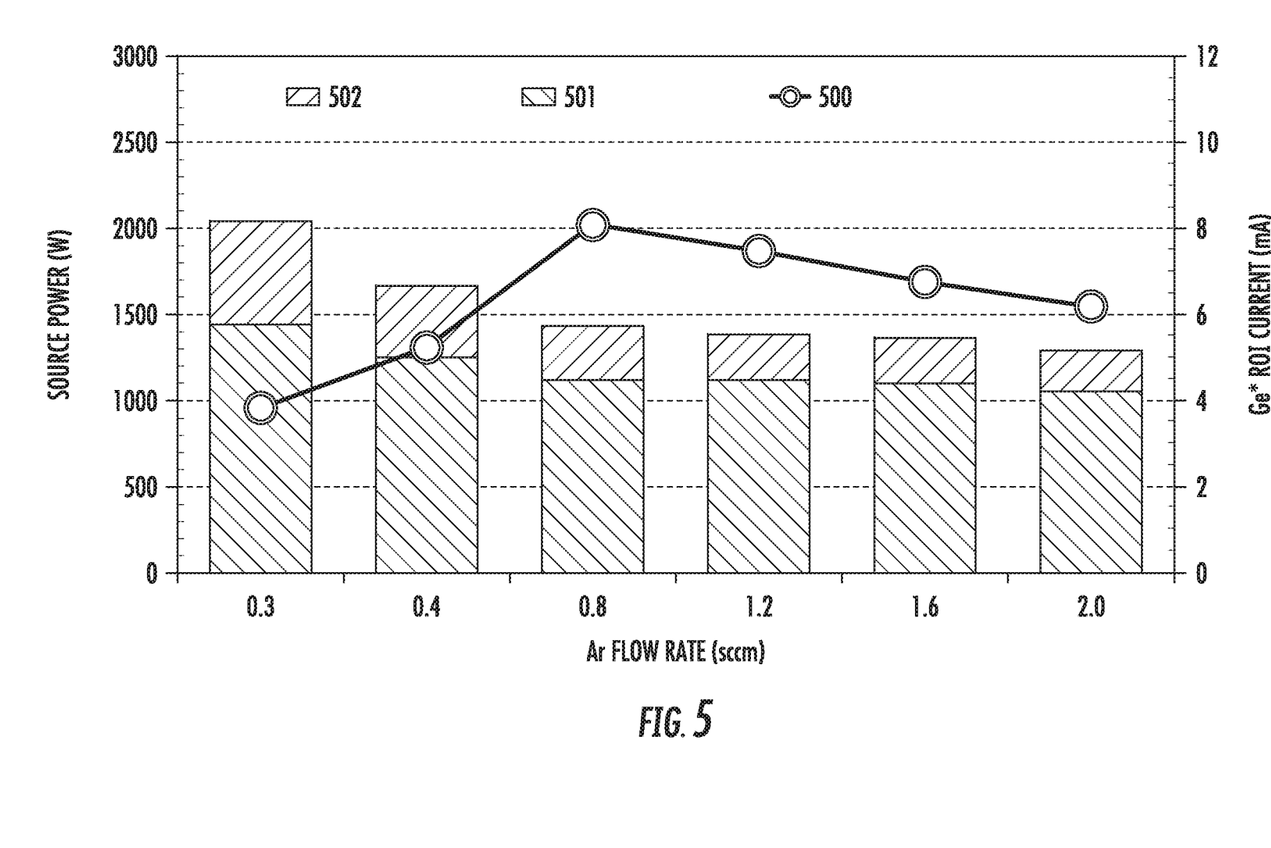
FIG. 5 is a representative graph showing germanium beam current, bias power and arc power as a function of argon flow rate.

FIG. 5 shows a graph of germanium beam current as a function of argon flow rate. The conditions for this experiment are as follows. The flow rate of germane was 5.46 sccm (standard cubic centimeters per minute), the extraction current is set to 40 mA and the beam energy is set to 20 keV. This test was performed using the IHC ion source 10 shown in FIG. 1.

The amount of argon introduced into the ion source was varied from 0.3 sccm to 2.0 sccm. It was found that when the argon flow rate was less than 0.25 sccm, the generation of a germanium ion beam was not possible. FIG. 5 shows the germanium beam current 500, the bias power 501 and the arc power 502 at each of these values. The bias power is the power applied by the cathode bias power supply 115 and the arc power is the power supplied by the arc power supply 111. The left vertical axis shows the total power used by the IHC ion source 10, which is the sum of these two power values. The right vertical axis shows the magnitude of the germanium beam current 500.

Note that, unexpectedly, there is a peak value of the germanium beam current 500. This peak corresponds to about 0.8 sccm of argon. Note that this test was performed using an extraction voltage of 20 kV and an extracted current of 40 mA. The peak value may vary at different extracted currents and beam energies. At increased values of argon flow rate, the germanium beam current 500 actually decreases. Without being bound to a particular theory, it is believed that the introduction of argon allows the ion source to operate more effectively and more collisions occur between the germane molecules and the electrons and argon atoms, ions and metastables. However, as the amount of argon increases, the collisions between argon atoms, ions and metastables increase, resulting in more argon beam current. Because the extraction current was fixed at 40 mA, the increase in argon beam current resulted in a decrease in germanium beam current. In other words, the germanium beam current decreases as the Ar+/Ge+ ratio increases above a certain threshold.

Figure 6A:
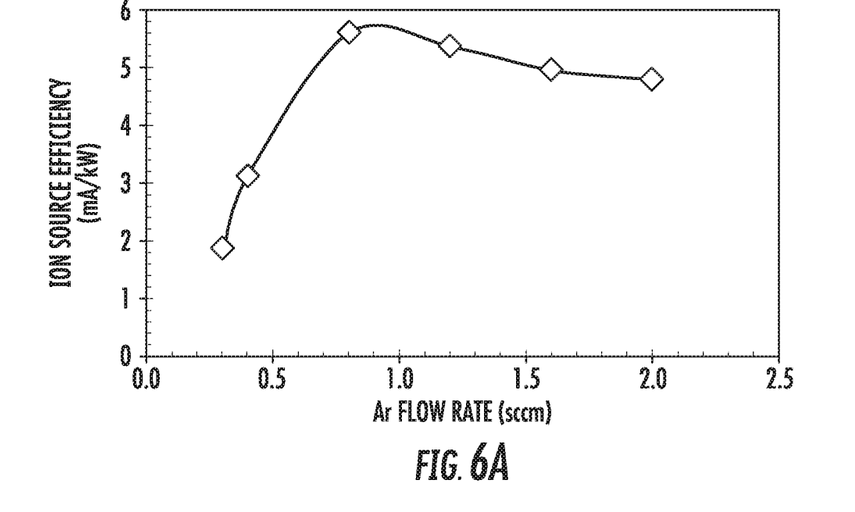
FIG. 6A shows the ratio of germanium beam current to source power, referred to as ion source efficiency, as a function of argon flow rate according to one embodiment.
Figure 6B:
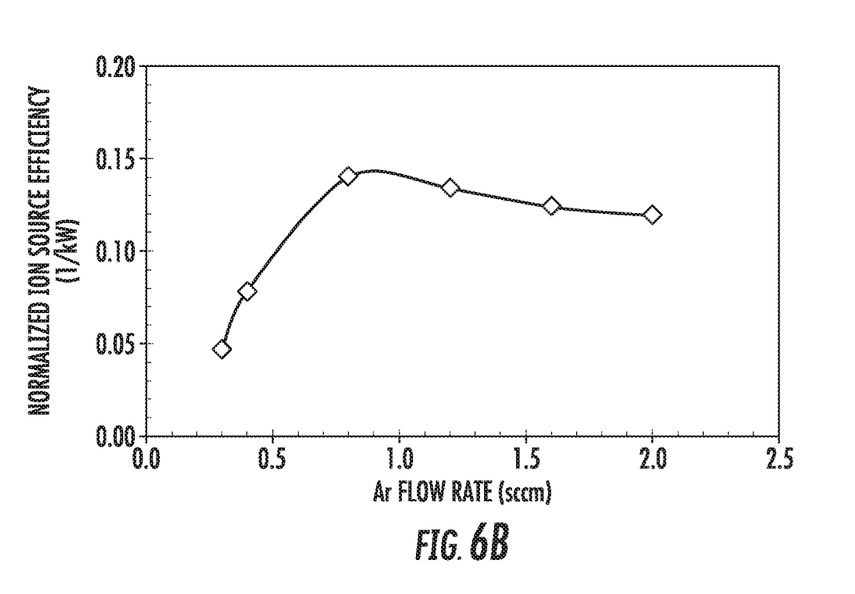
FIG. 6B shows normalized ion source efficiency as a function of argon flow rate according to one embodiment.

FIG. 6A shows the ratio of germanium beam current (in mA) to source power (in kilowatts) as a function of argon flow rate. The data from FIG. 5 is used to generate this graph. The ratio of germanium beam current to source power is a measure of the efficiency of the ion source. Note that as the argon flow increases to about 0.7 sccm, this ratio reaches a maximum value. This indicates that the ion source is operating most efficiently in this range. Note also that the ion source is more than twice as efficient at flow rates over 0.7 sccm as it is at a flow rate of 0.3 sccm. Thus, the use of argon may improve the efficiency of the ion source to a value greater than 4 mA per 1 kilowatt of total source power. FIG. 6B shows normalized ion source efficiency, defined as the ion source efficiency divided by the extraction current, as a function of argon flow rate. In the above figures, the extraction current was set to 40 mA. Thus, the values in this graph are equal to the values shown in FIG. 6A, divided by 40 mA. The graph of FIG. 6B may be used to normalize the data with respect to extraction current. Note that at increased flow rates of argon, this metric, defined as the germanium beam current (in mA) divided by total source power (in kilowatts), divided by extraction current (in mA), increases. The value of the normalized ion source efficiency exceeds 0.1 at value of argon flow rate greater than about 0.7 sccm. Note that as the argon flow rate continues to increase, the normalized ion source efficiency decreases, as shown in FIG. 6B. Thus, there is an upper limit of argon flow rate above which the normalized ion source efficiency will drop below 0.1.

Thus, it may be possible that a predetermined amount of argon, such as a range between 0.5 and 2.0 sccm, creates a more effective plasma in the ion source. In certain embodiments, the predetermined amount of argon may be between 0.7 and 1.0 sccm. Additionally, the bias power 501 and arc power 502 needed to generate this ion beam is actually much lower than the bias power 501 and arc power 502 needed at lower flow rates of argon. In other words, the power provided by cathode bias power supply 115 and the power provided by arc power supply 111 are less when the flow rate of argon is within the predetermined range and also result in greater germanium beam current 500! Further, note that the bias power 501 and the arc power 502 continue to decrease at increasingly higher levels of argon flow rate, but the germanium beam current 500 also decreases.

A test was performed to determine the composition of the extraction ion beam produced using an argon flow rate of 0.8 sccm and a germanium flow rate of 5.48 sccm. In this test, it was determined that germanium is extracted as $Ge^+$, $Ge^{++}$, and $Ge_2^+$. Argon is extracted as $Ar^+$, and $Ar^{++}$. No other peaks were detected. This indicates that the ion source itself is not affected by the ionization of germane and argon. For example, when $GeF_4$ is ionized, peaks that correspond to tungsten-based ions are also seen in the ion beam.

Figure 7:
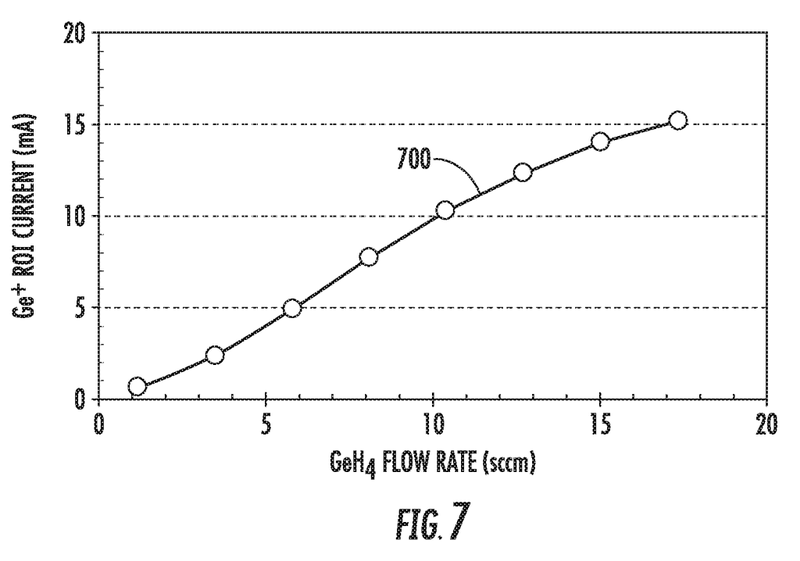
FIG. 7 shows the germanium ion beam current as a function of germane flow rate at a constant argon flow rate.

Further, this predetermined amount of argon flow rate may be independent of the flow rate of the germanium. For example, FIG. 7 shows the germanium beam current as a function of germane flow rate, with the argon flow rate fixed at 0.8 sccm. The other operating conditions are as follows. The extraction current is set to 60 mA and the final beam energy is set to 10 keV. Note that germanium beam current 700 continues increasing with increasing germane flow rate. Further, the total source power, which comprises the sum of the arc power and the bias power, actually decreases as the germane flow rate increases.

Thus, a method of increasing germanium beam current by adding a predetermined amount of argon to germane is disclosed. In certain embodiments, these gasses are introduced into an IHC ion source 10. In other embodiments, the gasses are introduced into an RF ion source 200. In certain embodiments, no halogen gasses are introduced into the ion source. This serves to extend the life of the ion source. In certain embodiments, the ion source may be a component of a beamline ion implantation system. The amount of argon that is introduced may vary and may be between 0.5 sccm and 2.0 sccm. In other embodiments, the amount of argon may be between 0.7 and 1.0 sccm. The amount of germane that is introduced can be between 1.2 sccm and 17.3 sccm for IHC ion sources. For RF ion sources, the maximum germane flow rate may be as high as about 30 sccm. Further, in certain embodiments, the amount of argon flow rate is such that the efficiency of the ion source is greater than 4 mA or germanium beam current per kilowatt of source power. In certain embodiments, the amount of argon flow rate is such that the normalized ion source efficiency is greater than 0.1.

In certain embodiments, an ion source is disclosed that introduces germane and argon into the chamber, where the amount of argon is between 0.5 sccm and 2.0 sccm for IHC ion sources. In certain embodiments, the amount of argon is between 0.7 to 1.0 sccm. For RF ion sources, such as that shown in FIG. 2, the argon flow rate may be between 0.5 and about 3.0 sccm. Mass flow controllers may be used to regulate the amount of germane and argon that are introduced into the chamber. In certain embodiments, the ion source is an IHC ion source. In other embodiments, the ion source comprises an RF ion source.

As stated above, the use of argon has also increased due to processes such as precision materials engineering (PME), selective area processing (SAP) and directional etching. Any technique that increases the argon beam current would be beneficial.

Figure 8:
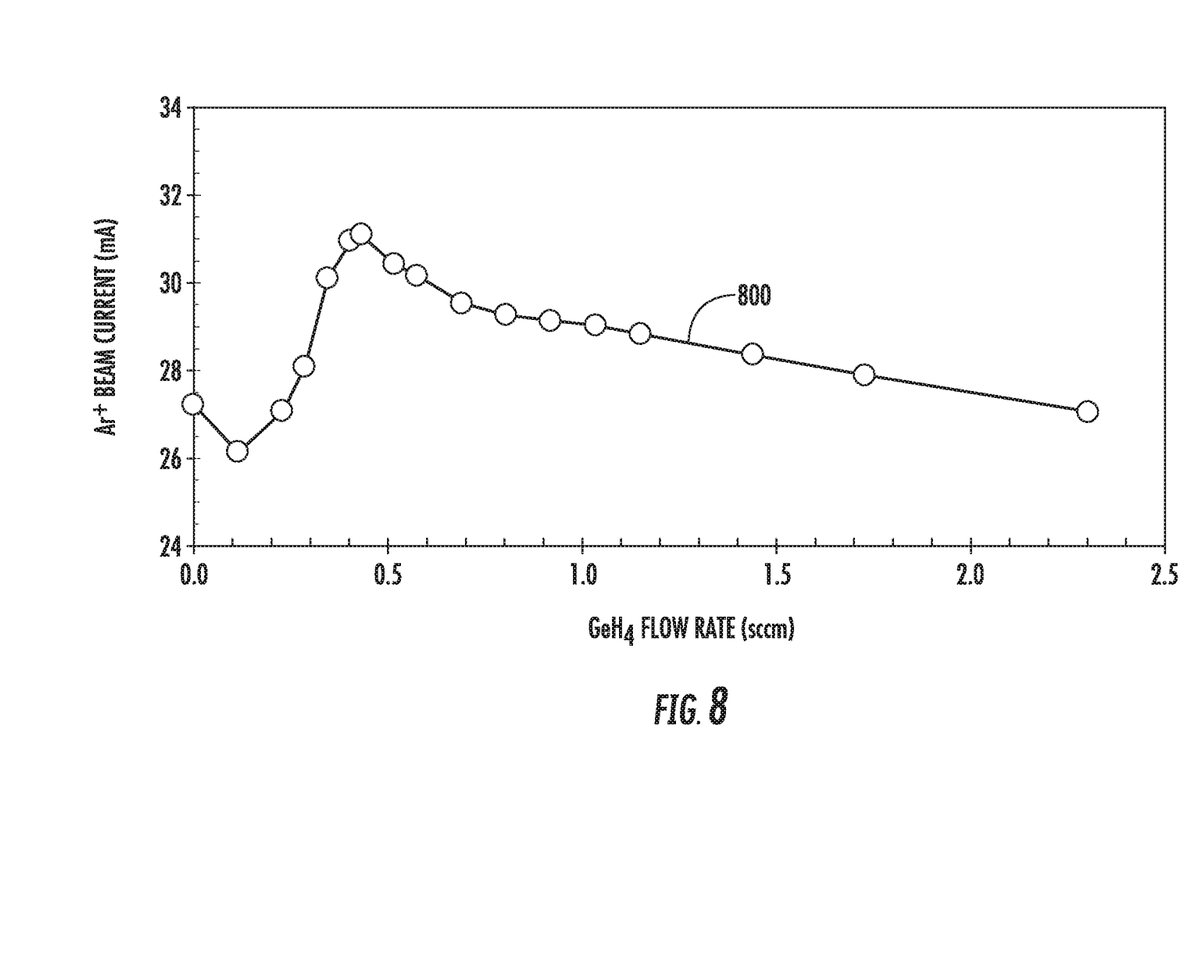
FIG. 8 shows the argon ion beam current as a function of germane flow rate.

In one test, it was found that the introduction of germane into an ion source with argon actually increased the argon beam current! FIG. 8 shows a graph where the vertical axis represents the argon beam current and the horizontal axis represents the amount of germane that is introduced into the IHC ion source 10 of FIG. 1. The extraction current was set to 60 mA and the beam energy was 20 keV. Additionally, the flow rate of argon was set to 2.5 sccm. The line represents the argon beam current 800. None of these parameters was changed as the flow rate of germane was increased.

With no germane, the argon beam current 800 was measured to be 27.2 mA, which is considered the baseline condition. By adding small amounts of germane, the argon beam current 800 increased and peaked at a value that is about 15% greater than the baseline. Specifically, at a germane flow rate of 0.43 sccm, the argon beam current 800 increased to 31.1 mA. Interestingly, the spectrum of the extracted ion beam did not show any presence of germanium. At higher germane flow rate, the argon beam current 800 began to decrease. Without being bound to any particular theory, it is possible that charge neutralization, particularly in the beam extraction region, may increase with increasing amounts of germane. Further, it is believed that an optimal amount of germane modifies the discharge conditions, such as the plasma electron energy distribution, which boosts the argon ion generation.

While 0.43 sccm appeared to be an optimal value, it is noted that advantageous results were achieved when the amount of germane was between 0.35 sccm and 1.00 sccm.

Thus, a method of increasing argon beam current by adding a predetermined amount of germane to argon is disclosed. In certain embodiments, these gasses are introduced into an IHC ion source 10. In other embodiments, the gasses are introduced into an RF ion source 200. In other embodiments, the ion source may utilize a Bernas source, a capacitively coupled plasma source, an inductively coupled source, or a microwave coupled plasma source disposed within or proximate the chamber of the ion source. In certain embodiments, the ion source may be a component of a beamline ion implantation system. The amount of germane that is introduced may vary and may be between 0.35 sccm and 1.00 sccm.

In certain embodiments, an ion source is disclosed that introduced germane and argon into the chamber, where the flow rate of germane is between 0.35 sccm and 1.00 sccm. Mass flow controllers may be used to regulate the amount of germane and argon that are introduced into the chamber. In certain embodiments, the ion source is an IHC ion source. In other embodiments, the ion source comprises an RF ion source. In other embodiments, the ion source may utilize a Bernas source, a capacitively coupled plasma source, an inductively coupled source, or a microwave coupled plasma source disposed within or proximate the chamber of the ion source. In certain embodiments, no halogen gasses are introduced into the ion source.

In another embodiment, germane is added to argon in an ion source such that the argon beam current increases at least 10% compared to a baseline without germane at the same extraction current. In some embodiments, the increase may be 15% at the same extraction current.

The methods and apparatus of the present disclosure have many advantages. First, as described above, the production of a germanium beam occurs without the use of halogens. This increases the life of the ion source. As is well known, halogens, such as fluorine, may etch the walls of the ion source, as well as the cathode of an IHC ion source. The ability of eliminate fluorine from the ion source dramatically extends the life of the ion source. Additionally, systems that utilize $GeF_4$ to produce germanium ion beams often utilize exotic gas mixtures such as xenon dihydride ($XeH_2$), which are very expensive, to order to reduce the halogen cycle. Thus, the use of germane and argon may be less expensive than other solutions. Further, the germanium beam current is proportional to germane flow rate, allowing high current germanium ion beams to be extracted.

With respect to argon ion beams, argon beam current can be increased by about 15% without impacting the operation of the ion source or the ion beam composition.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of generating an argon ion beam, comprising:
introducing germane and argon into an ion source and wherein no halogen gasses are introduced into the ion source;
ionizing the germane and argon to form a plasma; and
extracting argon ions from the ion source to form the argon ion beam, wherein a flow rate of germane is between 0.35 and 1.00 sccm and the flow rate of germane is such that a beam current of the argon ion beam is increased 10% to 15% relative to an argon ion beam generated without use of germane at a same extraction current, argon flow rate and beam energy;
wherein the beam current of the arqon ion beam generated without use of germane is about 27 mA.

2. The method of claim 1, wherein the ion source comprises an indirectly heated cathode ion source.

3. The method of claim 1, wherein the ion source comprises an RF ion source.

4. The method of claim 1, wherein the ion source comprises a Bernas source, a capacitively coupled plasma source, an inductively coupled source, or a microwave coupled plasma source.

5. The method of claim 1, wherein the ion source is a component of a beam-line implantation system.

* * * * *